United States Patent
Schmitt

(10) Patent No.: US 7,964,954 B2
(45) Date of Patent: Jun. 21, 2011

(54) INTEGRATED CIRCUIT HAVING A SEMICONDUCTOR SENSOR DEVICE WITH EMBEDDED COLUMN-LIKE SPACERS

(75) Inventor: Jean Schmitt, Zeitlarn (DE)

(73) Assignee: Infineon Technologies AG, Neubiberg (DE)

( * ) Notice: Subject to any disclaimer, the term of this patent is extended or adjusted under 35 U.S.C. 154(b) by 310 days.

(21) Appl. No.: 11/685,619

(22) Filed: Mar. 19, 2007

(65) Prior Publication Data

US 2007/0222005 A1   Sep. 27, 2007

(30) Foreign Application Priority Data

Mar. 13, 2006   (DE) .......................... 10 2006 011 753

(51) Int. Cl.
  *H01L 23/24*   (2006.01)
(52) U.S. Cl. ........ 257/687; 257/414; 257/415; 257/416; 257/417; 257/418; 257/419; 257/431; 257/432; 257/433; 257/434; 257/435; 257/678; 257/680; 257/681; 257/701; 257/702; 257/704; 257/729; 257/787; 257/788; 257/789; 257/790; 257/791; 257/792; 257/E23.116; 438/53; 438/64; 438/106; 438/116; 438/125; 438/126; 438/127
(58) Field of Classification Search .......... 257/678–733, 257/788–796, 414–419, 431–435, 787, E23.116; 438/106–127, 53, 64
See application file for complete search history.

(56) References Cited

U.S. PATENT DOCUMENTS

| | | | |
|---|---|---|---|
| 2,260,417 A | | 3/1938 | Whiteley et al. |
| 6,121,675 A | * | 9/2000 | Fukamura et al. ............ 257/680 |
| 6,441,503 B1 | * | 8/2002 | Webster ........................ 257/787 |
| 6,798,053 B2 | * | 9/2004 | Chiu ............................. 257/684 |
| 6,885,099 B2 | * | 4/2005 | Ogawa .......................... 257/701 |

FOREIGN PATENT DOCUMENTS

| | | | |
|---|---|---|---|
| DE | 4238113 A1 | * | 5/1994 |
| DE | 4411210 | | 10/1994 |
| DE | 102004043663 | | 3/2007 |
| JP | 2002039887 A1 | * | 2/2002 |
| JP | 2002107249 | | 4/2002 |
| JP | 2002039887 | | 6/2002 |
| WO | 2004106222 | | 12/2004 |
| WO | WO 2004106222 A1 | * | 12/2004 |
| WO | 2006026951 | | 3/2006 |

* cited by examiner

*Primary Examiner* — N Drew Richards
*Assistant Examiner* — John P Dulka
(74) *Attorney, Agent, or Firm* — Dicke, Billig & Czaja, PLLC

(57) ABSTRACT

An integrated circuit having a semiconductor sensor device including a sensor housing partly filled with a rubber-elastic composition is disclosed. One embodiment has a sensor chip with sensor region arranged in the interior of the housing. The sensor housing has an opening to the surroundings which is arranged in such a way that the sensor region faces the opening. The sensor chip is embedded into a rubber-elastic composition on all sides in the interior of the housing. The sensor housing has a sandwich-like framework having three regions arranged one above another, including an intermediate region with the rubber-elastic composition.

22 Claims, 4 Drawing Sheets

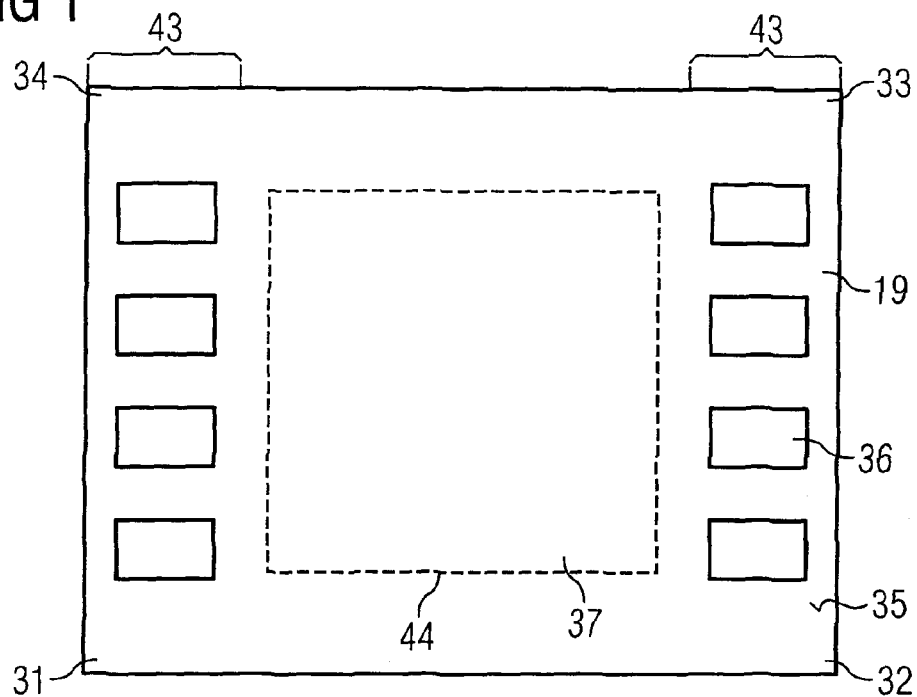
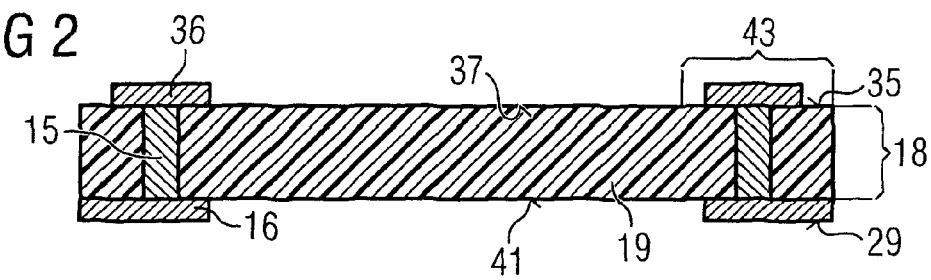
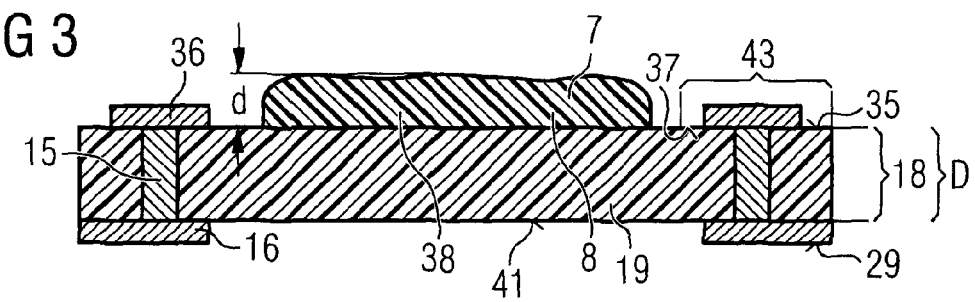
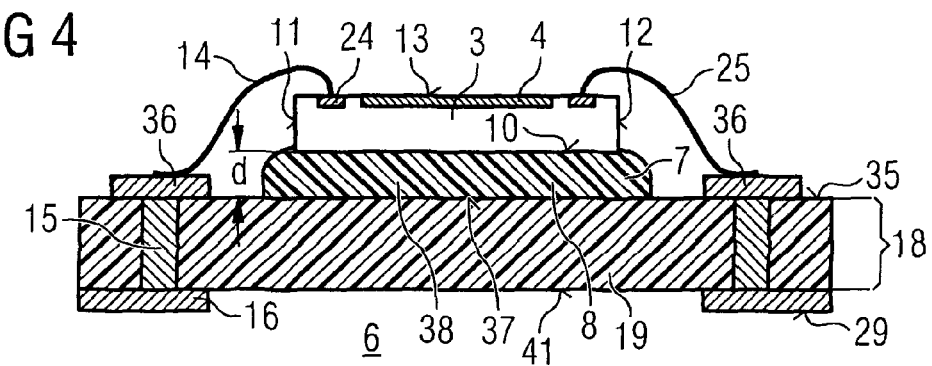

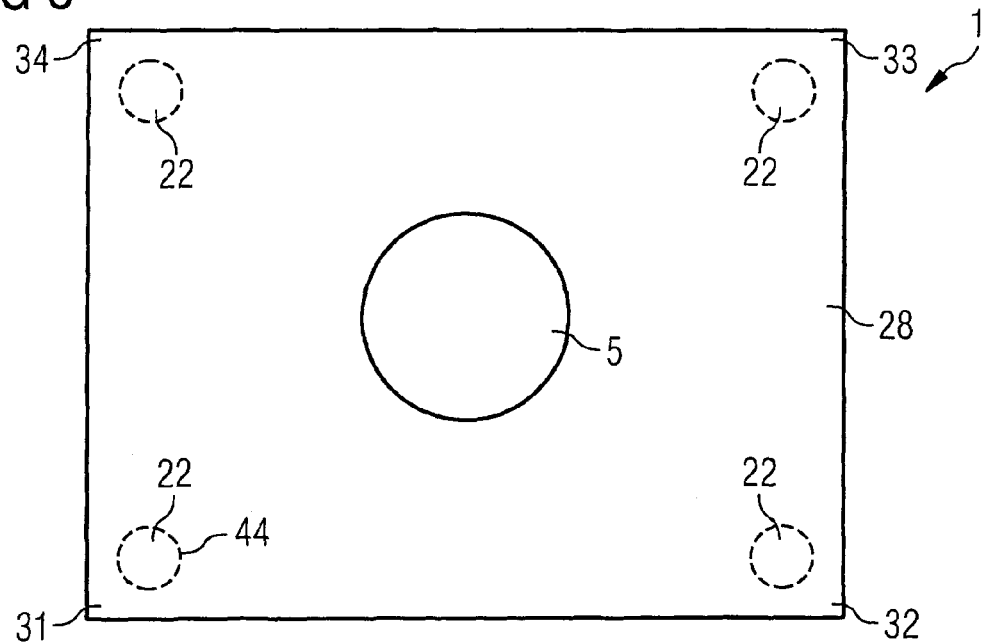
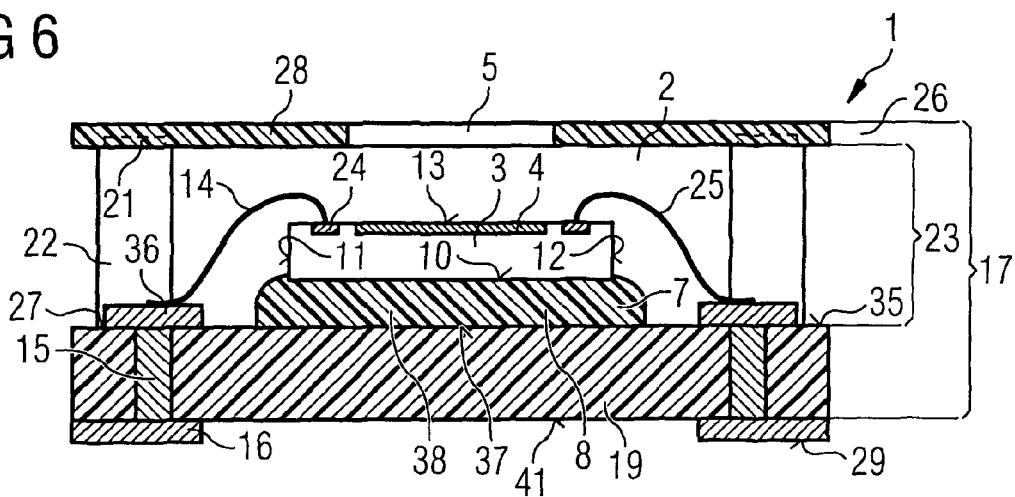
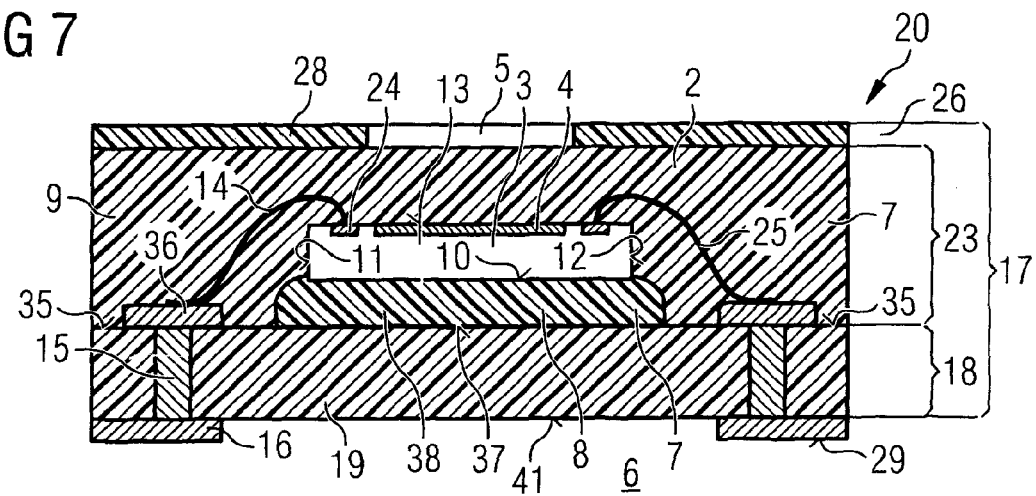

INTEGRATED CIRCUIT HAVING A SEMICONDUCTOR SENSOR DEVICE WITH EMBEDDED COLUMN-LIKE SPACERS

CROSS-REFERENCE TO RELATED APPLICATIONS

The utility patent application claims priority to German application DE 10 2006 011 753.0, entitled SEMICONDUCTOR SENSOR DEVICE WITH SENSOR HOUSING AND SENSOR CHIP AND METHOD FOR PRODUCING THE SAME, filed Mar. 13, 2006.

BACKGROUND

The invention relates to an integrated circuit having a semiconductor sensor device with sensor housing and sensor chip and a method for producing the same.

SUMMARY

A semiconductor sensor device is described in the earlier patent application DE 10 2004 043 663.0, published after the priority date. Semiconductor sensor devices of this type have the problem that the sensor chip is arranged in the sensor housing by way of a material having a low modulus of elasticity between stiff side walls or a stiff frame structure in such a way that perturbing effects of the mechanical loadings of the rigid surrounding sensor housing such as thermal strain or vibration loading act on the sensor chip and in part corrupt the measurement results.

Semiconductor chips of this type, in the sensor housing, are protected from the surroundings by a compliant rubber-elastic material into which the entire sensor chip is embedded in order to protect the sensor chip from external loadings. This can only partly succeed, however, in a confined sensor housing. Furthermore, the different coefficients of thermal expansion of the materials used cause losses of yield on account of mechanical stresses in the semiconductor sensor device.

JP 2002 039 887 A also discloses, in the case of a semiconductor device with sensor housing, embedding a sensor chip contact-connected by bonding wires into an elastic composition on all sides, so that it is mechanically decoupled better from the housing. Similar measures are also shown by JP 2002 107 249 A and U.S. Pat. No. 2,260,417 B1. However, the sensor chips are incorporated into rigid housings in each case, so that the advantages of embedding into a rubber-elastic composition on all sides cannot fully take effect. Furthermore, the semiconductor sensor devices with known sensor housings have the disadvantage that they are constructed in a complex manner and a manufacturing-technological and cost-effective simplification is virtually impossible.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention will now be explained in more detail with reference to the accompanying figures.

FIGS. 1 to 7 illustrate schematic views of components which are joined together for the production of a semiconductor sensor device.

FIG. 1 illustrates a schematic plan view of a substrate plate.

FIG. 2 illustrates a schematic cross section through the substrate plate from FIG. 1.

FIG. 3 illustrates a schematic cross section through the substrate plate in accordance with FIG. 2 after the application of a buffer layer composed of rubber-elastic composition.

FIG. 4 illustrates a schematic cross section through the substrate plate from FIG. 3 after the application of a sensor chip onto the buffer layer.

FIG. 5 illustrates a schematic plan view of a covering plate.

FIG. 6 illustrates a schematic cross section through the substrate plate from FIG. 4 after the application of the covering plate.

FIG. 7 illustrates a schematic cross section through a semiconductor sensor device after the filling of an intermediate region with rubber-elastic composition.

FIG. 8 illustrates a schematic plan view of a covering plate.

FIG. 9 illustrates a schematic cross section through a sandwich-like framework after the application of the covering plate onto corresponding spacers.

FIG. 10 illustrates a schematic cross section of the sandwich-like framework from FIG. 9 after the insertion of a mold stamp.

FIG. 11 illustrates a schematic cross section through a semiconductor sensor device of the second embodiment of the invention after the filling of an intermediate region and removal of the mold stamp.

DETAILED DESCRIPTION

Figure 8:
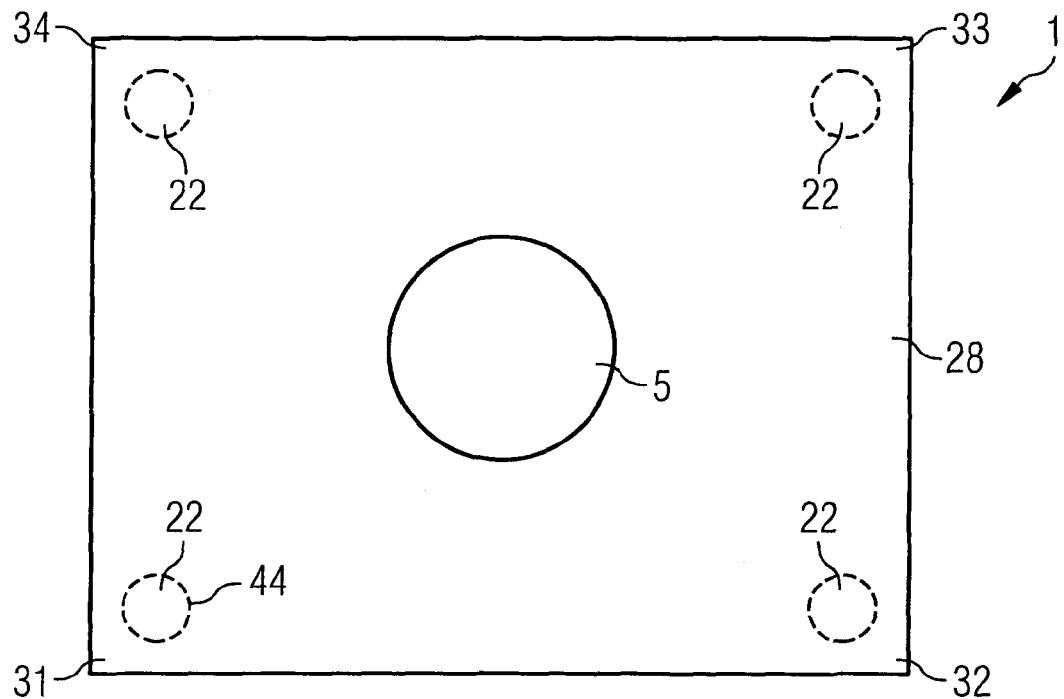
FIGS. 8 to 11 illustrate schematic views of components which are assembled for the production of a semiconductor sensor device of a second embodiment of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention relates to an integrated circuit having a semiconductor sensor device with sensor housing and sensor chip and a method for producing the same. For this purpose, the semiconductor sensor device has an interior partly filled with a rubber-elastic composition, and a sensor chip with sensor region arranged in the interior of the housing. The sensor housing has an opening to the surroundings which is arranged in such a way that the sensor region faces the opening. The sensor chip is embedded into a rubber-elastic composition on all sides in the interior of the housing.

One or more embodiments of the invention provide an integrated circuit having a semiconductor device having a sensor housing and a sensor chip and also a method for producing an integrated circuit having a semiconductor device having a sensor housing and a sensor chip such that, on the one hand, the yield in the production of semiconductor sensor devices of this type is improved further and, on the other hand, the reliability of semiconductor sensor devices of this type in daily practical measurement operation is improved further, and in addition the manufacturing costs are reduced further.

One embodiment provides a semiconductor sensor device having a sensor housing partly filled with a rubber-elastic composition. A sensor chip with sensor region is arranged in the interior of the housing, where in the sensor housing has an opening to the surroundings and the sensor region faces the opening. The sensor chip is embedded into a rubber-elastic composition on all sides in the sensor housing. For this purpose, the sensor housing includes a sandwich-like framework having three regions arranged one above another. A lower region has a substrate plate. A side-wall-free and frameless intermediate region has the rubber-elastic composition, in which are embedded the sensor chip and connecting elements to the substrate plate. An upper region has a covering plate, which has the opening to the surroundings that lies opposite the sensor region or is aligned with the sensor region.

A semiconductor sensor device of this type has the advantage that the transverse mobility of the sensor chip is in no way hindered during measurement recording, since the sandwich design of the framework does not constrict the transverse mobility of the semiconductor chip either by rigid side walls or by peripheral rigid frame structures. Moreover, construction having three regions stacked one on top of another in sandwich-like fashion affords the advantage that simplified manufacturing techniques can be used in order to complete a plurality of semiconductor sensor devices in parallel. Despite the decoupling between semiconductor chip and sensor housing, the protection of the sensor and of the connecting elements is nevertheless fully ensured by the rubber-elastic composition. Mechanical stresses which may act on the substrate plate in the lower region and on the covering plate in the upper region are essentially compensated for by the rubber-elastic composition.

Moreover, it is possible to reduce the size of the housing, since it is not necessary to fix any lead pieces in rigid walls of the sensor housing. Moreover, the sensor chip floats above the substrate plate and is only operatively connected to the substrate plate via compliant connecting elements. The intermediate region is freely accessible at the sides of the semiconductor sensor device with its rubber-elastic composition and does not have a conventional rigid plastic housing composition, which could constrict the transverse mobility of the semiconductor sensor chip embedded in the rubber-elastic composition.

In a further embodiment of the invention, the intermediate region has at least three spacers which extend from the substrate plate as far as the covering plate and are embedded in the rubber-elastic composition. The spacers facilitate mounting without impairing the mobility of the sensor chip in the rubber-elastic composition. For this purpose, four spacers are arranged in the four corner regions of a housing, wherein the ends of the spacers are cohesively connected to the substrate plate and the covering plate.

In the case of metallic spacers, which can simultaneously also fulfill through contact functions through the rubber-elastic composition, the cohesive connection may include a soldering connection. Adhesive connections are also possible. In one embodiment of the invention, the covering plate is produced in one piece with the spacers by injection-molding technology, with the result that a process of equipping the covering plate and/or the substrate plate during assembly of the sandwich-like framework of the semiconductor sensor device is obviated and can therefore be dispensed with in a cost-effective manner.

In a further embodiment, the substrate plate and/or the covering plate has a ceramic material. Ceramic materials are distinguished by the fact that their coefficient of thermal expansion is very close to that of the silicon semiconductor chip, with the result that thermal shear stresses practically no longer occur. On the other hand, ceramic materials are advantageous for semiconductor sensor devices which are used in radiofrequency technology. On account of the high mechanical decoupling between substrate plate, semiconductor chip and covering plate on account of the sandwich-like framework construction of the sensor housing, it is also possible to use a plastic laminate for the substrate plate and/or the covering plate. This renders the production costs significantly less expensive.

It is furthermore provided, in one embodiment, to equip the substrate plate with surface-mountable external contact areas of the semiconductor sensor device on its underside. External contact areas of this type may constitute solder deposits, which enable a further shrinking of the external dimensions of the semiconductor sensor device, especially as they can be produced in flatter fashion than solder balls that have hitherto been provided for surface mounting.

In order to produce a connection from the external contact areas to contact areas on the active top side of the semiconductor chip, the substrate plate has through contacts which interact with contact pads on the top side of the substrate and with the external contact areas, with the result that it is possible to produce a reliable connection between the sensor chip and the external contact areas.

It is furthermore provided that the substrate plate has a region provided with a mechanical buffer layer which has the rubber-elastic composition of the intermediate region and on which the sensor chip is fixed such that it is oscillation-mechanically decoupled from the substrate plate, wherein the buffer layer holds a sensor chip in floating fashion. The mechanical buffer layer also supports the relatively simple assembly of the semiconductor sensor device.

In addition, the semiconductor sensor device can be extended to form a sensor module without a high outlay, by providing a wiring structure on the substrate plate, so that further semiconductor chips can be arranged on the top side of the substrate plate prior to embedding into a rubber-elastic composition. In order to ensure an interaction of the sensor chip with the substrate plate of the housing and thus also with further and additional semiconductor chips, the semiconductor sensor device has connecting elements which, on the one hand, are electrically connected to contact areas of the sensor chip and are embodied as bonding wires and are additionally connected to contact pads on the substrate plate.

As a result of the position of the sensor chip on a buffer layer, two regions arise in the sandwich-like construction of the semiconductor sensor device within the rubber-elastic composition, namely a lower region below the sensor chip, which encompasses the buffer layer on which the rear side of the sensor chip is arranged, and an upper region composed of rubber-elastic composition, into which the edge sides and the top side of the sensor chip with the sensor region and the connecting elements are embedded. The rubber-elastic composition in the intermediate region may have an optically transparent elastomer if the sensor chip has to detect optical signals. In order to detect pressure-technological signals, rubber-elastic compositions composed of silicone rubber have proved worthwhile.

In order to achieve a coupling of the sensor region of the sensor chip to the surroundings which is as free from disturbances as possible, in one embodiment of the invention, the rubber-elastic composition has a depression above the sensor region of the sensor chip, which depression reduces the thickness of the rubber-elastic composition above the sensor region. The depression may have different contours. Thus, it is possible to form a convex contour or a concave contour for optically transparent rubber-elastic compositions, in order to achieve optical concentration or scattering. It is also possible to furnish the depression in the rubber-elastic composition with a cylindrical contour, with the result that a uniformly thinned layer of the rubber-elastic composition covers the sensor region, which is particularly advantageous for pressure-recording sensors.

A method for producing a panel for a plurality of semiconductor components having interiors partly filled with a rubber-elastic composition has the following method processes. The first process involves producing a substrate plate with a plurality of semiconductor device positions, wherein in the semiconductor device positions external contact areas are provided on the underside and contact pads are provided on the top side of the substrate plate. The external contact areas and the contact pads are electrically connected to one another via through contacts through the substrate plate. In the individual semiconductor device positions of the substrate plate for a plurality of semiconductor sensor devices, at least one central region or a central position is left free for the fitting of a sensor chip. A structured mechanical buffer layer having a rubber-elastic composition is applied onto the central position or the central region.

Afterward, sensor chips are fixed by their rear sides onto the buffer layers in the individual semiconductor device positions. This is followed by a connection of contact areas of the sensor chip to contact pads of the substrate plate via connecting elements, via bonding wires. Spacers and a covering plate with openings for the sensor regions of the sensor chips in the semiconductor device positions are subsequently applied onto the substrate plate that has been prepared and equipped with semiconductor chips in this way. Finally, the interspace between substrate plate and covering plate is filled with a rubber-elastic composition with embedding of the sensor chips, the connecting elements and the spacers.

This method produces a sandwich-like panel having a rigid substrate plate, a rubber-elastic intermediate region and a rigid covering plate. In order to produce individual semiconductor sensor devices from a panel of this type, the panel merely has to be subsequently separated into semiconductor sensor devices. Sawing techniques and/or laser ablation techniques can be used for the separation. The separation gives rise to semiconductor sensor devices which have rubber-elastic material on their edge sides and no rigid side walls or peripheral rigid frames. Moreover, the panel has the advantage that a large number of semiconductor sensor devices can be manufactured inexpensively by parallel production, which is favorable from the standpoint of manufacturing technology.

In a further exemplary implementation of the method, it is provided that prior to the filling of the intermediate region with a rubber-elastic composition, mold stamps are inserted into the openings of the covering plate. The mold stamps have the contour of depressions for the rubber-elastic composition. Prior to the separation or else after the separation of the panel, the mold stamps can be removed whilst uncovering a depression in the rubber-elastic composition. The corresponding various possibilities mentioned above for the shaping of the depressions arise depending on the contour of the mold stamp.

In a further embodiment for implementing the method, a stamp plate having a plurality of mold stamps is positioned on the covering plate prior to the filling of the intermediate region with a rubber-elastic composition, wherein the mold stamps of the stamp plate are introduced into the openings of the covering plate. This is associated with the advantage that the fashioning of depressions in the rubber-elastic composition of the intermediate region can be performed simultaneously for all the semiconductor device positions of a substrate plate. In this case, too, in order to be able to reuse the stamp plate, the stamp plate is removed from the covering plate prior to the separation of the panel into individual semiconductor sensor devices.

The application of a structured mechanical buffer layer may be effected by printing methods. A stencil printing method, a screen printing method or else a jet printing method is available for this purpose. Since the buffer layer is applied over a relatively large area in order to receive and fix the rear side of a semiconductor sensor chip, printing methods of this type are advantageous compared with other possibilities, especially as in the case of the printing methods a multiplicity of buffer layers can be applied onto a substrate plate for a plurality of semiconductor components in parallel and simultaneously.

If the spacers and the covering plate are not embodied in one piece, then it is advantageous to equip either the substrate plate or the covering plate with spacers and to connect them cohesively to the plates. For filling the intermediate region that arises in this case, it is advantageous to apply the rubber-elastic composition by dispensing technology. Thermocompression and/or thermosonic bonding methods are available for fitting bonding wires on the contact areas of the sensor chip and on contact pads of the substrate plate.

FIG. 1 illustrates a schematic plan view of a substrate plate 19. A substrate plate 19 of this type is made available for the production of an integrated circuit semiconductor sensor device 20, the sensor plate 19 illustrated here representing only one semiconductor device position of a larger panel for a plurality of semiconductor sensor devices. The sensor plate 19 has a central region 37 or a central position on its top side 35, a dashed line 44 showing the contours of the central region, on which a sensor chip with a mechanical buffer zone arranged in between is applied in the subsequent processes. Contact pads 36 are arranged in the edge regions 43 of the substrate plate 19, on which contact pads bonding wires can be positioned.

FIG. 2 illustrates a schematic cross section through the substrate plate 19 from FIG. 1. On the underside 41 of the substrate plate 19, the edge regions 43 of the substrate plate 19 have external contact areas 29 of external contacts 16 which are electrically connected to the contact pads 36 on the top side 35 of the substrate plate 19 via through contacts 15. The substrate plate 19 forms the lower region 18 of a semiconductor sensor device which is constructed in sandwich-like fashion and includes a lower region 18, an intermediate region (not illustrated here) and an upper region.

FIG. 3 illustrates a schematic cross section through the substrate plate 19 in accordance with FIG. 2 after the application of a buffer layer 38 composed of rubber-elastic composition 7. The rubber-elastic composition 7 is applied in the central region 37 and forms the buffer layer 38, which can carry a sensor chip and, on account of its rubber-elastic properties, provides a mechanical decoupling with respect to the substrate plate 19. The buffer layer 38 can be applied in the central region 37 by dispensing, by a screen printing method or by a stencil printing method and/or by a jet printing method. Its thickness d approximately corresponds to the thickness D of the substrate plate 19 in order to achieve a mechanical buffering.

FIG. 4 illustrates a schematic cross section through the substrate plate 19 from FIG. 3 after the application of a sensor chip 3 onto the buffer layer 38. This can be done by lightly pressing the rear side 10 of the sensor chip 3 into the rubber-elastic composition 7 of the buffer layer 38 before the buffer layer 38 is crosslinked to a higher extent by a heat treatment and enters into a cohesive connection with the rear side 10 of the sensor chip 3 in the process.

The active top side 13 with the sensor region 4 of the sensor chip 3 is freely accessible in this state, so that connecting elements 25 in the form of bonding wires 14 can be led from contact areas 24 on the top side 13 of the sensor chip 3 to contact pads 36 of the substrate plate 19. The rubber-elastic composition 7 of the buffer layer 38 has been precrosslinked in the meantime to an extent such that thermocompression and/or thermosonic bonding is possible. In this stage of the production of a semiconductor sensor device, the edge sides 11 and 12 are still freely accessible and not completely covered by the rubber-elastic composition 7. The sensor region 4, too, is still freely accessible.

FIG. 5 illustrates a schematic plan view of a covering plate 28, which at the same time also represents a plan view of the semiconductor sensor device 20. The covering plate 28 of the sensor housing 1 has a central opening 5 facing the sensor region of the semiconductor chip. The positions of spacers 22 that are fitted cohesively on the underside of the covering plate 28 are marked by dashed lines 44, the next figure showing how the covering plate 28 with the cohesively connected spacers is placed onto the substrate plate 19 which is equipped with a sensor chip and is shown in FIG. 4.

FIG. 6 illustrates a schematic cross section through the substrate plate 19 from FIG. 4 after the application of the covering plate 28. This gives rise to a sensor housing 2 that forms a sandwich-like framework 17 composed of three regions, namely a lower region 18, an intermediate region 23 and an upper region 26. The lower region 18 is formed by the substrate plate 19. The intermediate region 23, which here is still similar to a conventional sensor housing to the greatest possible extent, has the components illustrated in FIG. 4, such as connecting elements 25, semiconductor chip 3 and buffer layer 38. The upper region 26 is essentially formed by the covering plate 28, at which, in this embodiment of the invention, spacers 22 are arranged by one end 21 in each of the corner regions 31, 32, 33 and 34 shown in FIG. 5, and are then cohesively connected by the other end 27 to the substrate plate 19.

FIG. 7 illustrates a schematic cross section through a semiconductor sensor device 20 after the filling of the intermediate region 23 with rubber-elastic composition 7. Since the spacers do not lie in this sectional plane, they disappear in the rubber-elastic composition 7, which also completely embeds the edge sides 11 and 12 and also the top side 13 of the sensor chip 3 and the connecting elements 25. The opening 5 in the covering plate 28 is aligned with the sensor region 4 of the sensor chip 3, with the result that the sensor region 4 is operatively connected to the surroundings 6. This sandwich-like design yields a semiconductor sensor device 20 which has no rigid side walls nor a rigid peripheral frame, as a result of which the sensor chip 3 is mechanically decoupled from the substrate plate 19 and the covering plate 28. The rubber-elastic composition 7 in the interspace 23 into which the sensor chip 3 is embedded on all sides is composed of a lower region 8 with the buffer layer 38 and an upper region 9 with the filled rubber-elastic composition 7.

FIGS. 8 to 11 illustrate schematic views of components which are assembled for the production of a semiconductor sensor device 30 of a second embodiment of the invention. Components having the same functions as in the previous figures are identified by the same reference symbols and are not discussed separately.

FIG. 8 illustrates a schematic plan view of a covering plate. The covering plate 28 does not differ from the covering plate 28 illustrated in FIG. 5 and has spacers 22 in its corner regions 31, 32, 33 and 34, the positions of the spacers being identified by dashed lines 44. The opening 5, too, has been maintained as in the first embodiment of the invention.

Figure 9:
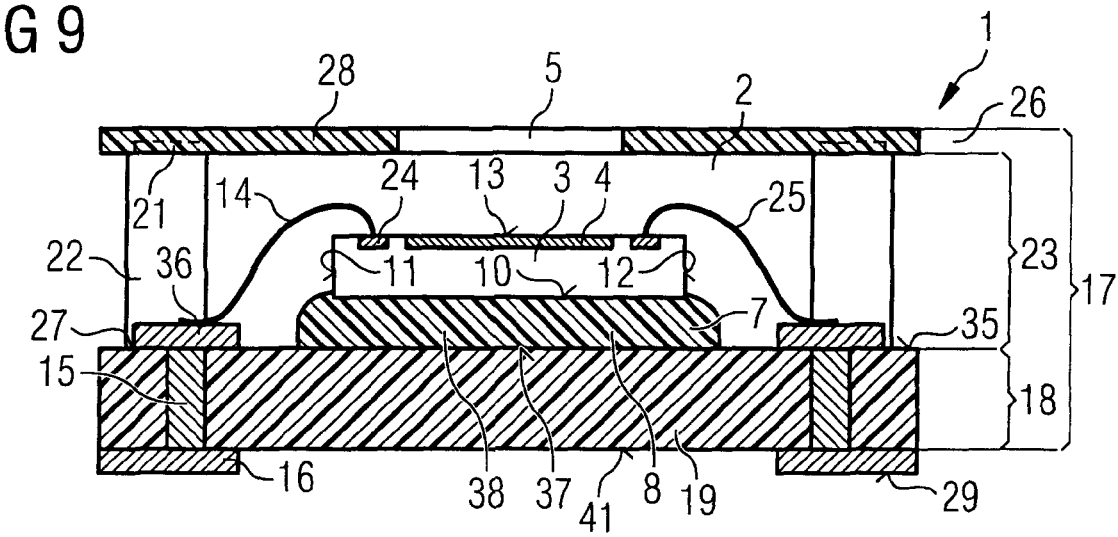

FIG. 9 illustrates a schematic cross section through a sandwich-like framework 17, which has a sensor housing 1 with an interior 2 and, on account of the sandwich-like construction, has neither side walls nor frame structures which surround the sensor chip 3 in conventional sensor housings.

Figure 10:
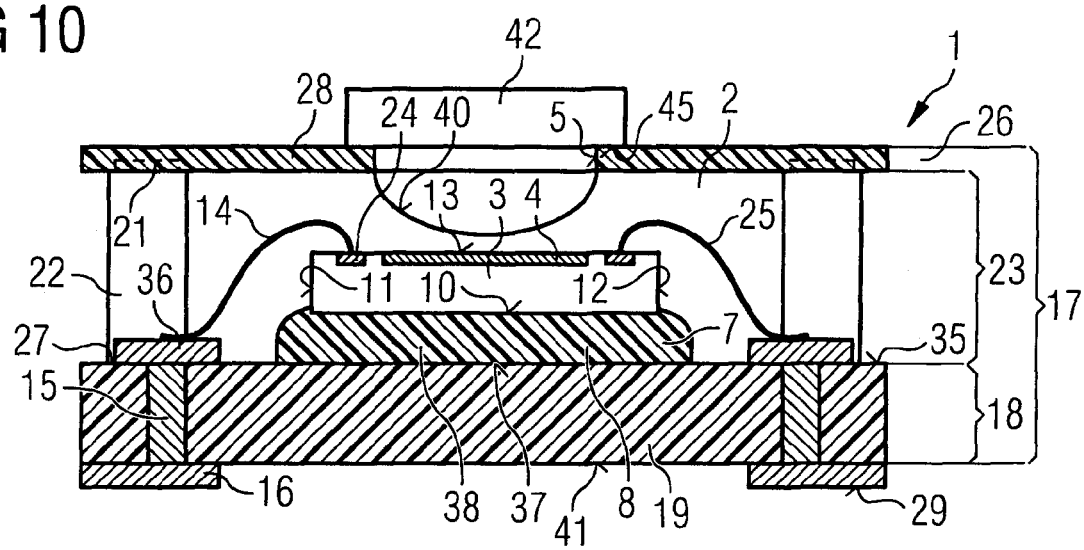

FIG. 10 illustrates a schematic cross section through the sandwich-like framework 17 from FIG. 9 after the insertion of a mold stamp 42 into the opening 5 of the covering plate 28. The mold stamp 42 has a shoulder 45 by which it is positioned on the covering plate 28. Its contour 40 projecting into the intermediate region 23 predefines a depression which is intended to arise in the rubber-elastic composition 7 during the filling of the intermediate region 23.

Figure 11:
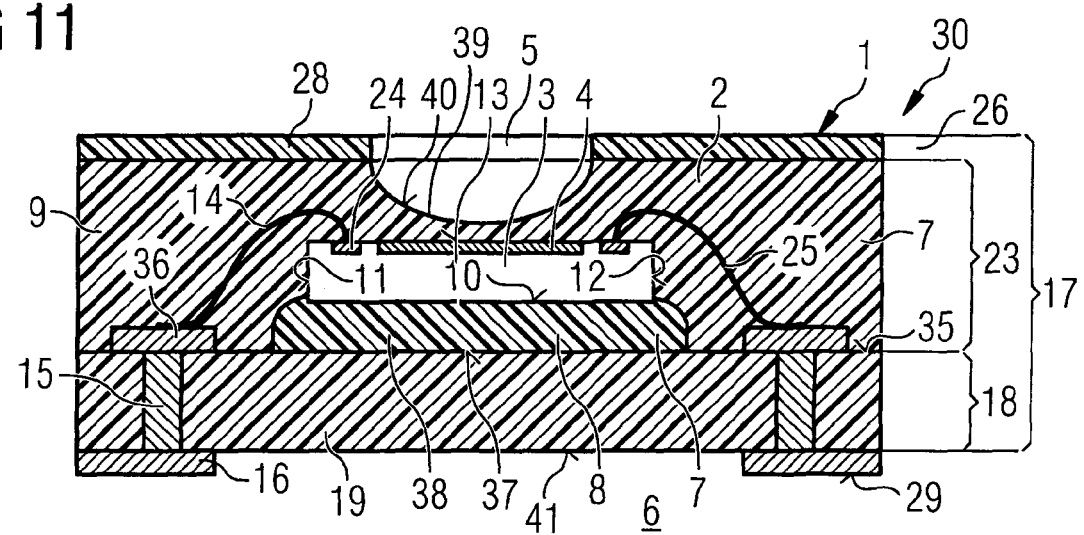

FIG. 11 illustrates a schematic cross section through a semiconductor sensor device 30 of the second embodiment of the invention after the filling of the intermediate region 23 with a rubber-elastic composition 7 and the removal of the mold stamp 42 shown in FIG. 10. A depression 39 remains in the rubber-elastic composition 7 below the opening 5, the depression having the contour 40 of the mold stamp, the contour shown here having a convex form. However, it is also possible to produce cylindrical forms and also concave forms. This depends, on the one hand, on what function the semiconductor sensor device is intended to fulfill, and, on the other hand, on the degree to which the coupling of the sensor region 4 to the surroundings 6 is to be formed.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a semiconductor sensor device comprising:
    a sensor housing having three regions arranged one above another in a sandwich-like framework, the three regions including:
        a lower region comprising a substrate plate
        an upper region comprising a covering plate supported by and spaced from the substrate plate by a plurality of column-like spacers which extend from the substrate and are spaced apart from one another, the covering plate including an opening to the surroundings; and
        an intermediate region comprising a space between the substrate plate and covering plate;
    a sensor chip with a sensor region arranged in the intermediate region of the housing, wherein the sensor region faces the opening in the covering plate, and wherein the intermediate region is filled with a rubber-elastic composition such that the sensor chip is embedded in the rubber-elastic composition with the entire surfaces all sides contacting the rubber-elastic compound and such that the sensor chip is spaced from the substrate plate, the covering plate, and the column-like spacers, with the column-like spacers also being embedded in the rubber-elastic composition such that the rubber-elastic composition forms exterior side faces of the sensor housing in the intermediate region.

2. The integrated circuit of claim 1, comprising:
connecting elements which connect contact regions on the sensor chip to contact regions on the substrate plate, the connecting elements being embedded in the rubber-elastic composition.

3. The integrated circuit of claim 1, comprising at least three spacers which extend from the substrate plate as far as the covering plate.

4. The integrated circuit of claim 1, wherein the intermediate region has four spacers arranged in four corner regions of the housing.

5. The integrated circuit of claim 1, wherein the spacers have spacer rods whose ends are cohesively connected to the substrate plate and the covering plate.

6. The integrated circuit of claim 1, wherein the spacers have a metal and partly serve as through contacts through the intermediate region.

7. The integrated circuit of claim 1, wherein the substrate plate and/or the covering plate have a ceramic material.

8. The integrated circuit of claim 1, wherein the substrate plate and/or the covering plate have a plastic laminate.

9. The integrated circuit of claim 1, wherein the substrate plate has surface-mountable external contact areas of the integrated circuit on its underside.

10. The integrated circuit of claim 1, wherein the substrate plate has on its top side contact pads which are electrically connected to surface-mountable external contacts of the integrated circuit via through contacts through the substrate plate.

11. The integrated circuit of claim 1, wherein the substrate plate has a region provided with a mechanical buffer layer which has the rubber-elastic composition of the intermediate region and on which the sensor chip is fixed such that it is oscillation-mechanically decoupled from the substrate plate, wherein the buffer layer carries the sensor chip in floating fashion.

12. The integrated circuit of claim 1, wherein the top side of the substrate plate has a wiring structure with further semiconductor chips of a sensor module which are arranged thereon.

13. The integrated circuit of claim 1, wherein the sensor chip has contact areas which are electrically connected to contact pads of the substrate plate via connecting elements, bonding wires.

14. The integrated circuit of claim 1, wherein the rubber-elastic composition has two regions a lower region below the sensor chip, on which the rear side of the sensor chip is arranged, and an upper region, into which the edge sides and the top side of the sensor chip with the sensor regions are embedded.

15. The integrated circuit of claim 1, wherein the rubber-elastic composition has an optically transparent elastomer.

16. The integrated circuit of claim 1, wherein the rubber-elastic composition has silicone rubber.

17. The integrated circuit of claim 1, wherein the rubber-elastic composition has a depression above the sensor region of the sensor chip, which depression reduces the thickness of the rubber-elastic composition above the sensor region.

18. The integrated circuit of claim 17, wherein the depression in the rubber-elastic composition has a convex contour.

19. The integrated circuit of claim 17, wherein the depression in the rubber-elastic composition has a cylindrical contour, with the result that a uniformly thinned layer of the rubber-elastic composition covers the sensor region.

20. An integrated circuit comprising:
a sensor chip housing having an opening to a surrounding environment, the housing including
a substrate plate;
a cover plate supported by and spaced apart from the substrate plate by a plurality of spacer elements so as to form a housing space between the substrate plate and the cover plate, the spacer elements spaced apart from one another and extending between the substrate plate and the cover plate; and
a rubber-elastic compound which embeds the spacer elements and fills the housing space and forms exterior perimeter side walls of the sensor chip housing in the housing space; and
a sensor chip embedded within the rubber-elastic compound so that the entire surfaces of all sides of the sensor chip directly contact the rubber-elastic compound and so that the sensor chip is spaced from the substrate plate, the cover plate, the spacer elements, and the perimeter side walls of the housing space and positioned so that a sensor region of the sensor chip faces the opening.

21. The integrated circuit of claim 20, wherein the opening is in the cover plate.

22. The integrated circuit of claim 21, wherein contact areas on a surface of the sensor chip on which the sensor region is disposed and contact areas on the substrate plate are connected by bonding wires, and wherein the bonding wires are embedded in the rubber-elastic compound.

* * * * *